(12) United States Patent
Jansen (10) Patent No.: US 10,778,270 B1
(45) Date of Patent: Sep. 15, 2020

(54) HIGH DYNAMIC RANGE RECEIVER INTEGRATED INTO A CHIP PACKAGE

(71) Applicant: BAE Systems Information and Electronic Systems Integration Inc., Nashua, NH (US)

(72) Inventor: Douglas S. Jansen, Durango, CO (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 0 days.

(21) Appl. No.: 16/675,624

(22) Filed: Nov. 6, 2019

(51) Int. Cl.
*H04B 1/16* (2006.01)
*H04B 1/06* (2006.01)
(Continued)

(52) U.S. Cl.
CPC ........... *H04B 1/16* (2013.01); *H01L 23/5383* (2013.01); *H01L 23/66* (2013.01);
(Continued)

(58) Field of Classification Search
CPC ........ H04B 1/50; H04B 1/109; H04B 1/0053; H04B 1/0475; H04B 15/02; H03F 3/04;
(Continued)

(56) References Cited

U.S. PATENT DOCUMENTS 6,980,776 B2 * 12/2005 Shimada ................. H04B 1/40
333/100
7,012,489 B2 3/2006 Sherrer et al.
(Continued)

OTHER PUBLICATIONS

Cali, et al., "Wideband Transceiver Employing Diverse Semiconductor and Packaging Technologies," Low-Cost High Performance Transceiver for Next Generation Defense Applications. Distribution Statement C.—Distribution authorized to U.S. Government agencies and their contractors (ITAR) (Jan. 11, 2019). Warning—This document contains technical data whose export is restricted by the Arms Export Control Act (Title 22, U.S.C., Sec 2751 et seq.) or the Export Administration Act of 1979, as amended. 6 pages.

*Primary Examiner* — Quochien B Vuong
(74) *Attorney, Agent, or Firm* — Finch & Maloney PLLC; Scott J. Asmus (57) ABSTRACT

A communications receiver. One example embodiment is a system-in-package (SIP) device, which includes a three-dimensional interposer, a first bandpass filter integrated into the three-dimensional interposer, a first integrated circuit chip on the three-dimensional interposer, a second integrated circuit chip on the three-dimensional interposer, a second bandpass filter integrated into the three-dimensional interposer, and a third bandpass filter integrated into the three-dimensional interposer. The first integrated circuit chip includes a balanced amplifier that receives a first filtered signal and suppress distortion products. The second integrated circuit chip includes a first mixer and a second mixer. The first mixer receives an output of the balanced amplifier and mixes the output with a first oscillator signal. The second bandpass filter receives an output from the first mixer and generates a second filtered signal. The second mixer receives the second filtered signal and mixes the second filtered signal with a second oscillator signal.

18 Claims, 6 Drawing Sheets

(51) Int. Cl.
*H04B 1/00* (2006.01)
*H01L 25/065* (2006.01)
*H01L 23/66* (2006.01)
*H01L 23/538* (2006.01)
*H01Q 21/00* (2006.01)
*H01Q 5/314* (2015.01)

(52) U.S. Cl.
CPC ....... *H01L 25/0655* (2013.01); *H04B 1/0007* (2013.01); *H01L 2223/6688* (2013.01); *H01Q 5/314* (2015.01); *H01Q 21/00* (2013.01)

(58) Field of Classification Search
CPC . H03F 3/19; H03F 3/087; H03F 3/187; H03F 3/195; H03F 3/45475; H03F 3/45766; H03F 3/45991; H03F 2200/111; H03F 2200/294; H03F 2200/372; H03F 2200/451

See application file for complete search history.

(56) References Cited

U.S. PATENT DOCUMENTS

| | | | |
|---|---|---|---|
| 7,557,673 B1 | 7/2009 | Meharry | |
| 7,702,295 B1* | 4/2010 | Nicholls | H04B 15/00 455/194.2 |
| 7,847,653 B2 | 12/2010 | Meharry | |
| 8,026,775 B2 | 9/2011 | Meharry | |
| 8,035,565 B2* | 10/2011 | Gamand | H01Q 1/38 343/700 MS |
| 8,494,470 B2* | 7/2013 | Khoini-Poorfard | H04B 1/30 455/256 |
| 8,787,964 B2* | 7/2014 | Soman | H04B 1/18 455/279.1 |
| 9,831,845 B2* | 11/2017 | Tanaka | H03G 3/3068 |
| 10,075,207 B2* | 9/2018 | Betti-Berutto | H04W 52/0209 |
| 2003/0030494 A1* | 2/2003 | Huang | H01P 5/16 330/302 |
| 2020/0105881 A1* | 4/2020 | Ramaswamy | H01L 29/2003 |

* cited by examiner

HIGH DYNAMIC RANGE RECEIVER INTEGRATED INTO A CHIP PACKAGE

GOVERNMENT LICENSE RIGHTS

This invention was made with government support under contract # HR0011-15-C-0103 and contract # HR0011-17-C-0005 awarded by the Defense Advanced Research Projects Agency (DARPA). The government has certain rights in the invention.

BACKGROUND

Receivers with wide tuning ranges are desirable for various applications, including radar warning systems, identification friend-or-foe (IFF) systems, and general radio frequency (RF) communication systems. Wide tuning range receivers that span much greater than one octave of bandwidth typically require a bank of pre-select filters to suppress unwanted images, second-order spurs and various mixer crossing spurs. Furthermore, such receivers often require multiple intermediate frequency (IF) filters to deal with additional frequency spurs at and around the IF frequency. To these ends, there are a number of non-trivial issues associated with developing wide-band RF receivers.

BRIEF DESCRIPTION OF THE DRAWINGS

Features and advantages of embodiments of the claimed subject matter will become apparent as the following Detailed Description proceeds, and upon reference to the Drawings, in which:

Although the following Detailed Description will proceed with reference being made to illustrative embodiments, many alternatives, modifications, and variations thereof will be apparent in light of this disclosure.

DETAILED DESCRIPTION

Wide-band RF receivers are useful tools for listening across a large frequency bandwidth for various types of signals and are especially important in situations where the frequency of interest may not be known beforehand. Example situations include electronic warfare or surveillance where enemy signals can be intercepted and decoded, scrambled, or altered to confuse the enemy receivers. In such situations, the enemy signal may vary across a wide possible frequency range, thus requiring an RF receiver to scan across a large frequency range to identify possible enemy signals.

As noted above, there are a number of non-trivial issues associated with developing wide-band RF receivers. For example, the use of multiple pre-select filters and IF filters consume considerable volume and require greater power consumption. Thus, embodiments of a wide-band RF receiver are provided herein. To overcome the issues discussed above, a multi-pronged approach is taken, according to one such embodiment. First, a multi-layer balun structure is used with a low-noise amplifier (LNA) to suppress $2^{nd}$ order distortion products over a wide frequency range. Second, a high IF frequency is selected along with high local oscillator frequencies to reduce unwanted images and signal spurs. These features allow for a reduction of the number of pre-select and IF filters needed. For example, these features allow for a receiver having a single pre-select filter and a single IF filter while maintaining a high dynamic range over a wide frequency range. Various integration techniques are also used to incorporate the components of the RF receiver into a system-in-package (SIP) design that greatly reduces the total size of the RF receiver. Although embodiments herein are disclosed with reference to an RF receiver, it should be understood that such embodiments may also be utilized in an RF transceiver.

In one specific embodiment, a wideband receiver includes a first bandpass filter, a balanced amplifier, a first mixer, a second bandpass filter, a second mixer, and a third bandpass filter. The first bandpass filter receives an input RF signal and generates a first filtered signal having a frequency range with a first bandwidth greater than or equal to one octave above a lowest frequency in the frequency range. One octave is defined as double the frequency that the receiver is being tuned to. For example, if the wideband receiver is tuned to receive a frequency range from 5 GHz to 20 GHz, the bandwidth of 15 GHz is 1.5 octaves above 5 GHz. The balanced amplifier receives the first filtered signal and suppresses distortion products within the first bandwidth. The first mixer receives an output of the balanced amplifier and mixes the output with a first oscillator signal. The second bandpass filter receives an output from the first mixer and generates a second filtered signal. The second bandpass filter is centered at a first intermediate frequency that is higher than any frequency within the first bandwidth. The second mixer receives the second filtered signal and mixes the second filtered signal with a second oscillator signal. The third bandpass filter receives an output from the second mixer and generates a third filtered signal. The third bandpass filter is centered at a second intermediate frequency that is lower than the first intermediate frequency. By utilizing a balanced amplifier to suppress distortion products across the entire bandwidth of the first filtered signal, no more than a single first bandpass filter having a large bandwidth (e.g., at least one octave) is needed, which reduces overall system complexity, power consumption, and device footprint, according to an embodiment. This is in contrast with prior receiver designs that similarly attempt to listen across a wide bandwidth range (e.g., for electronic warfare purposes.) Such prior receiver designs typically require multiple pre-select bandpass filters with each bandpass filter having a smaller bandwidth (e.g., less than one octave) in order to achieve the same dynamic range.

In another embodiment, a SIP device includes a three-dimensional interposer, a first bandpass filter integrated into the three-dimensional interposer, a first integrated circuit chip on the three-dimensional interposer, a second integrated circuit chip on the three-dimensional interposer, a second bandpass filter integrated into the three-dimensional interposer, and a third bandpass filter integrated into the three-dimensional interposer. The first bandpass filter receives an input RF signal and generates a first filtered signal having a first bandwidth. The first integrated circuit chip includes a balanced amplifier that receives the first filtered signal and suppress distortion products within the first bandwidth. The second integrated circuit chip includes a first mixer and a second mixer. The first mixer receives an output of the balanced amplifier and mixes the output with a first oscillator signal. The second bandpass filter receives an output from the first mixer and generates a second filtered signal. The second mixer receives the second filtered signal and mixes the second filtered signal with a second oscillator signal. The third bandpass filter receives an output from the second mixer and generates a third filtered signal. By integrating the receiver components both within and on the three-dimensional interposer, the overall device footprint is reduced, and the power consumption may be reduced as well, according to an embodiment.

Numerous variations and alternative embodiments will be appreciated in light of this disclosure. The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. When used to describe a range of dimensions, the phrase "between X and Y" represents a range that includes X and Y.

RF Receiver Overview

Figure 1:
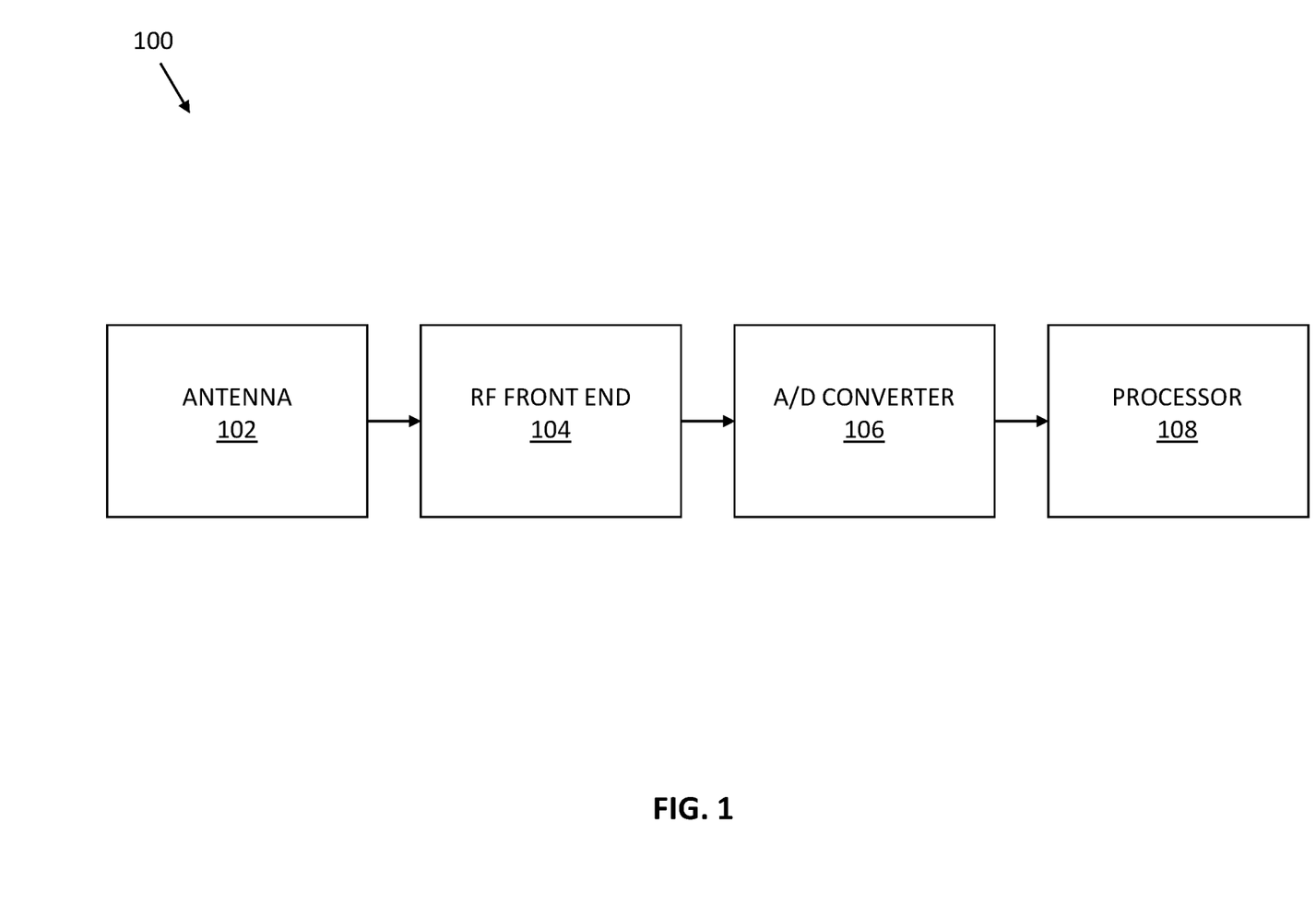
FIG. 1 illustrates a block diagram of an RF receiver system, in accordance with an embodiment of the present disclosure.

FIG. 1 illustrates an example RF receiver (or transceiver) 100, according to an embodiment. RF system 100 includes an antenna 102, RF front end circuitry 104, an analog-to-digital converter (ADC) 106, and a processor 108. In some cases, RF receiver 100 is implanted as a system-on-chip, or a chip set populated on a printed circuit board (PCB) which may in turn be populated into a chassis of a multi-chassis system or an otherwise higher-level system, although any number of implementations can be used. RF receiver 100 may be one portion of an electronic device that sends and/or receives RF signals.

Antenna 102 may include one or more patch antennas or microstrip antennas, according to some embodiments. Any number of antennas may be included in antenna 102. In some embodiments, antenna 102 may include one or more antennas to support multiple communication bands (e.g., dual band operation or tri-band operation). For example, some of the antennas may support tri-band operation at 28 gigahertz, 39 gigahertz, and 60 gigahertz. Various ones of the antennas may support tri-band operation at 24.5 gigahertz to 29 gigahertz, 37 gigahertz to 43 gigahertz, and 57 gigahertz to 71 gigahertz. Various ones of the antennas may support 5G communications and 60 gigahertz communications. Various ones of the antennas may support 28 gigahertz and 39 gigahertz communications. Various ones of the antennas may support millimeter wave communications. Various ones of the antennas may support high band frequencies and low band frequencies. In a more general sense, antenna 102 may be any number of antenna types and configurations suitable for receiving (and possibly transmitting) desired communication signals, as will be appreciated.

RF front end circuitry 104 may include various components that are designed to filter, amplify, and tune selected portions of a received RF signal, according to an embodiment. RF front end circuitry may be designed to have a high dynamic range that can tune across a wide bandwidth of frequencies. For example, RF front end circuitry 104 may include components that are capable of tuning to particular frequency ranges within a signal having a bandwidth in the gigahertz range, such as bandwidths between 5 GHz and 50 GHz. For example, the RF front end in one example includes one or more mixers for down-conversion of the RF signal such as to an IF signal. In some embodiments, RF front end circuitry 104 includes one or more integrated circuit (IC) chips packaged together in a SIP. The SIP may include a three-dimensional interposer that provides mounting locations for each of the various ICs, as well as filters provided in the interposer. Further details regarding the design and implementation of RF front end circuitry 104 are provided herein with reference to FIGS. 2 and 3, according to some example embodiments of the present disclosure.

ADC 106 may be implemented to receive a filtered, amplified RF signal from RF front end circuitry and to convert the signal into a digital signal for further processing. ADC 106 may be any known type of ADC without limitation. In some embodiments, ADC 106 has a linear range of between about 6 GHz and about 10 GHz, and the output resolution is in the range of 6 to 12 bits, although the present disclosure is not intended to be limited to such specific implementation details.

Processor 108 may be configured to receive the digitized signal and perform any number of operations with the signal. For example, processor 108 may look for particular patterns or signatures in the received digital signal. As used herein, the term "processor" may refer to any device or portion of a device that processes electronic data from registers and/or memory to transform that electronic data into other electronic data that may be stored in registers and/or memory. Processor 108 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, custom-built semiconductor, or any other suitable processing devices.

Figure 2:
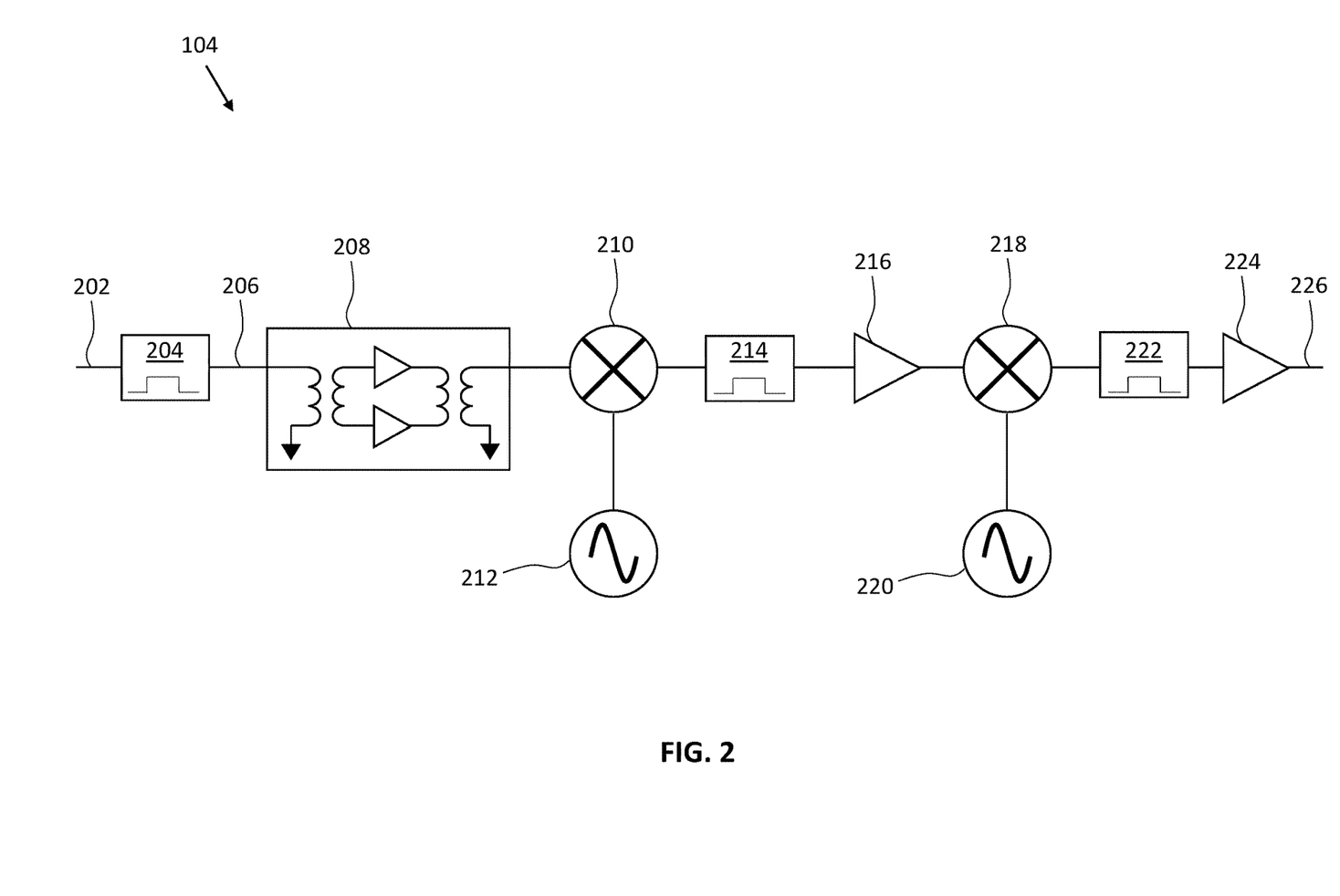
FIG. 2 illustrates a schematic diagram of RF front end circuitry in the RF receiver system of FIG. 1, in accordance with an embodiment of the present disclosure.

FIG. 2 illustrates a schematic representation of at least a portion of RF front end circuitry 104, according to an embodiment. An input signal 202 is received from antenna 102 and an output signal 226 is produced to be sent on to ADC 106. According to an embodiment, output signal 226 is a filtered and amplified portion of input signal 202.

Input signal 202 is received by a first filter 204. First filter 204 may be a bandpass filter or a lowpass filter that selects the dynamic frequency bandwidth of interest depending on the application. For example, first filter 204 may produce a signal having a frequency range in the gigahertz range. In one example, first filter 204 produces a signal having a total bandwidth between 10 GHz and 20 GHz. In some examples, first filter 204 produces a signal having a bandwidth of at least 5 GHz, at least 10 GHz, at least 15 GHz, or at least 20 GHz. In some examples, first filter 204 produces a signal having a bandwidth greater than or equal to one octave above a lowest frequency in the frequency range. In some examples, first filter 204 produces a signal having a bandwidth greater than one octave above a lowest frequency in the frequency range. In contrast, prior receiver designs may include multiple input bandwidth filters with each having a smaller bandwidth (e.g., less than one octave each). First filter 204 may be designed to have a sharper cutoff at the higher end of the bandwidth compared with the low end of the bandwidth. The resulting filtered output signal 206 from first filter 204 may be considered as having an input bandwidth or a first bandwidth. In some embodiments, first filter 204 represents only a single bandpass filter or lowpass filter having a large bandwidth (as opposed to a bank of bandpass filters with each having a lower bandwidth).

Filtered output signal 206 is received by a balanced low-noise amplifier (LNA) 208, according to an embodiment. Balanced LNA 208 is designed to cancel distortion products over the entire input bandwidth with high linearity. New developments in monolithic passive structures allow for single chip balanced amplifiers, such as balanced LNA 208, having a 10:1 bandwidth or greater. To achieve this, balanced LNA 208 includes multi-layer balun structures that are monolithically integrated with low noise, high linearity amplifiers, according to some embodiments. The topology of balanced LNA 208 may improve $2^{nd}$ order distortion by over 20 dB for a 3 dB increase in DC power. The wide dynamic range of balanced LNA 208 removes the need for a bank of pre-select filters to mitigate IP2 spurs.

Briefly, balanced LNA 208 divides the received filtered output signal 206 into high frequency and low frequency bands. Two different baluns, one with a low frequency band output and one with a high frequency band output, are used with the outputs of these two baluns being combined to give a full bandwidth signal. As a result, when the outputs are combined, balun functionality is retained over effectively twice the geometric bandwidth (e.g., over the combined bandwidth of the constituent baluns.) Further details regarding the structure and operation of balanced LNA 208 may be found in co-owned U.S. Pat. Nos. 8,026,775 and 7,557,673, the disclosures of which are herein incorporated by reference.

The output from balanced LNA 208 is received by a first mixer 210 where the output signal from the LNA 208 is mixed with a first oscillator signal 212. According to an embodiment, first oscillator signal 212 is adjustable to select a particular portion of the input signal bandwidth that remains after the mixed signal passes through second filter 214. According to an embodiment, oscillator signal 212 has a frequency ($LO_1$) that is greater than the highest frequency within the input bandwidth to the first mixer 210. In some examples, $LO_1$ is at least double the highest frequency within the input bandwidth of the LNA 208. In some examples, $LO_1$ is greater than any frequencies within the mixed signal output from first mixer 210.

The mixed signal output from first mixer 210 is received by a second filter 214, according to an embodiment. Second filter 214 may be a bandpass filter centered at an intermediate frequency (IF) that is greater than the highest frequency within the input bandwidth and less than $LO_1$. In some examples, the IF frequency is at least 1.5 times higher than the highest frequency within the input bandwidth. Having the IF frequency be far away from the frequencies of the input bandwidth, along with a higher $LO_1$ frequency, pushes mixing spurs away from the IF, and pushes the image far from the desired passband of second filter 214. According to an example embodiment, this allows for second filter 214 to be used to accept a multi-octave portion of the RF spectrum without images or mixing spurs intruding into the desired passband of second filter 214. In some embodiments, second filter 214 represents only a single bandpass filter (as opposed to a bank of bandpass filters for use with different frequency bands).

The bandwidth of the passband of second filter 214 in one example dictates the size of the RF portion that is being taken from the input bandwidth. The size of the passband of second filter 214 may be dynamically adjustable or fixed depending on the application. In some embodiments, the passband width of second filter 214 is about 1-2 GHz as this is a typical bandwidth that is compatible with standard ADC devices. In some other embodiments, the passband width of second filter 214 is greater, such as at least 5 GHz, or at least 10 GHz. In some embodiments, the passband width of second filter 214 is less than half of the input bandwidth.

According to an example embodiment, the passband frequencies of second filter 214 are fixed and the value of $LO_1$ selects which portion of filtered output signal 206 is to be up-converted into the passband frequencies of second filter 214.

Figure 3:
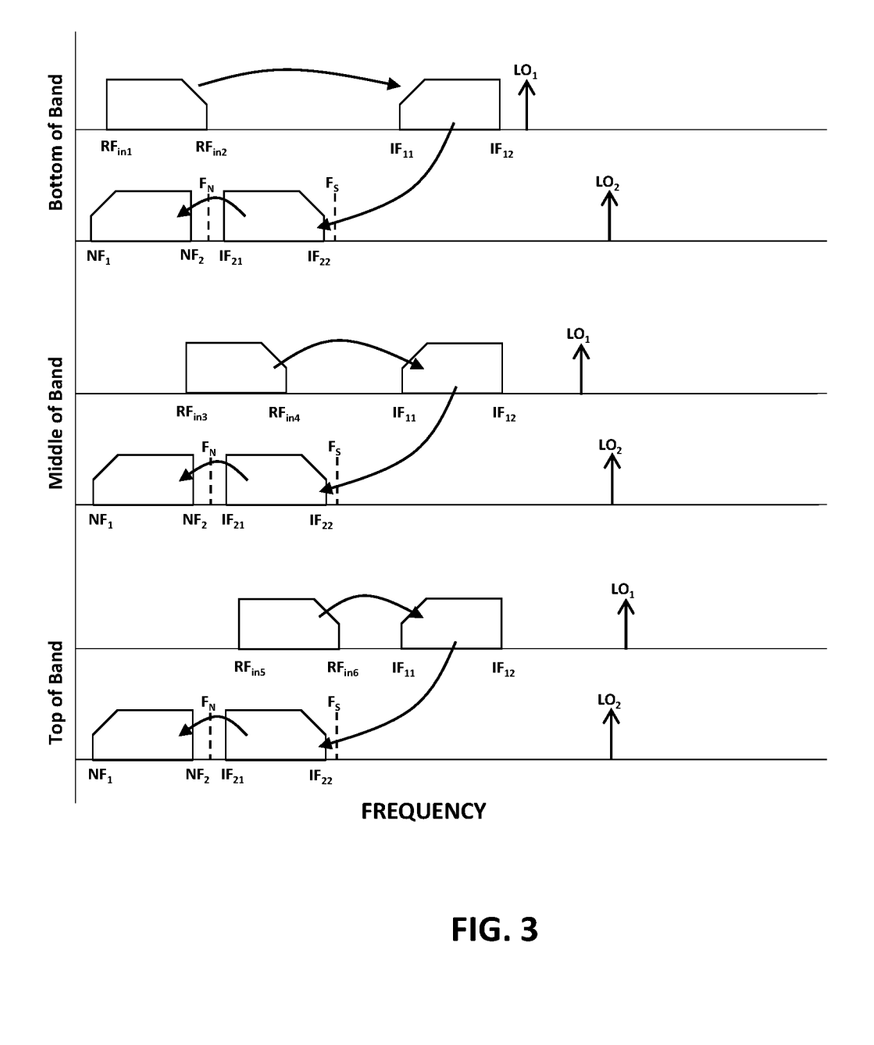
FIG. 3 illustrates an example frequency plan using the RF front end circuitry of FIG. 2, according to an embodiment.

FIG. 3 illustrates an example frequency plan for different relative values of $LO_1$ and an input signal having an input bandwidth that spans between $RF_{in1}$ and $RF_{in6}$. In the example shown in FIG. 3, second filter 214 has a passband between $IF_{11}$ and $IF_{12}$, thus providing a filtered output signal having a bandwidth spanning between $IF_{11}$ and $IF_{12}$. The frequency value of $LO_1$ is selected to up-convert a portion of the input signal from $RF_{in1}$ to $RF_{in2}$ to lie between the passband ($IF_{11}$-IF12) of second filter 214. When $LO_1$ is increased, a portion of the input signal from $RF_{in3}$ to $RF_{in4}$ is up-converted to lie between the passband of second filter 214. When $LO_1$ is increased even further, a portion of the input signal from $RF_{in5}$ to $RF_{in6}$ is up-converted to lie between the passband of second filter 214. The value of $LO_1$ may be selected to be any frequency to mix with the input signal and select some portion of the input signal to be up-converted to a desired frequency range. In some embodiments, second filter 214 has its passband in frequencies that are higher than $LO_1$.

Referring back to FIG. 2, the output from second filter 214 is received by a first amplifier 216, according to an embodiment. First amplifier 216 may have any known amplifier configuration to amplify the passband frequencies from second filter 214. With reference to the example illustrated in FIG. 3, first amplifier 216 may be designed to amplify signals having a frequency range between $IF_{11}$ and $IF_{12}$ with high linearity.

The amplified signals having a desired bandwidth are received by a second mixer 218 where the signal is mixed with a second oscillator signal 220. According to an embodiment, second oscillator signal 220 is fixed at a given frequency ($LO_2$) to down-convert the frequencies within the desired passband to a lower frequency range that is more compatible with downstream devices (such as an ADC). Referring again to the example illustrated in FIG. 3, $LO_2$ is fixed at a given frequency regardless of which portion of the input bandwidth was up-converted into the $IF_{11}$-$IF_{12}$ portion of the spectrum. Mixing the passband frequencies from second filter 214 with $LO_2$ down-converts the frequencies between $IF_{11}$ and $IF_{12}$ to a lower frequency range between $IF_{21}$ and $IF_{22}$. Also illustrated is a further aliasing of the signal into frequencies from $NF_1$ to $NF_2$ as they are mirrored across the Nyquist frequency $F_N$ (e.g., half of the sampling frequency at the top end of the input bandwidth).

The mixed signal output from second mixer 218 is received by a third filter 222, according to an embodiment. Third filter 222 may be a bandpass filter centered at a final IF consistent with the down-converted frequency range resulting from second mixer 218. Additionally, the passband of third filter 222 may sharply cut off at either end of the lower frequency range. Referring again to the example illustrated in FIG. 3, the signal from $IF_{11}$-$IF_{12}$ was down-converted to a signal between $IF_{21}$ and $IF_{22}$. Accordingly, third filter 222 may be designed to have a center frequency of ($IF21+IF_{22}$)/2 and a total passband width of ($IF_{22}$-$IF_{21}$) to pass only the signal within the desired range between $IF_{21}$ and IF$_{22}$. As this is only one example, third filter 222 may be designed to have any desired center frequency and passband width depending on the application and what frequency range is requested for further downstream processing. In the example illustrated in FIG. 3, IF$_{21}$ and IF$_{22}$ are placed in the $2^{nd}$ Nyquist band (referring to the Nyquist frequency F$_N$). In some other embodiments, IF$_{21}$ and IF$_{22}$ can be placed in any higher Nyquist band.

The output from third filter 222 is received by a second amplifier 224, according to an embodiment. Second amplifier 224 may have any known amplifier configuration to amplify the passband frequencies from third filter 222. With reference to the example illustrated in FIG. 3, second amplifier 222 may be designed to amplify signals having a frequency range between IF$_{21}$ and IF$_{22}$ with high linearity. The resulting output signal 226 from third filter 222 may be passed on to ADC 106 for further processing.

According to some embodiments, each of the components illustrated in FIG. 2 may be incorporated into a package as a system-in-package (SIP). For example, balanced LNA 208, first amplifier 214, and second amplifier 222 may each be monolithically integrated on a same first semiconductor chip or provided on different semiconductor chips of the same material. In some embodiments, the first semiconductor chip is gallium arsenide (GaAs), although other group III-V semiconductor materials such as gallium nitride (GaN) or indium gallium arsenide (InGaAs), and/or group IV semiconductor materials such as silicon or germanium or silicon germanium (SiGe), may be used to implement the various semiconductor chips of the example embodiments provided herein, as will be appreciated. In another example, first mixer 210 and second mixer 218 may each be monolithically integrated on a same second semiconductor chip. In some embodiments, the second semiconductor chip is silicon germanium (SiGe). In yet another example, first filter 204, second filter 214, and third filter 222 may be monolithically integrated on a same third semiconductor chip or integrated into a three-dimensional interposer. The SIP may include an interposer that is coupled to the first, second, and third semiconductor chips, or the SIP may include the three-dimensional interposer (having the integrated filters) that is coupled to the first and second semiconductor chips.

Figure 4:
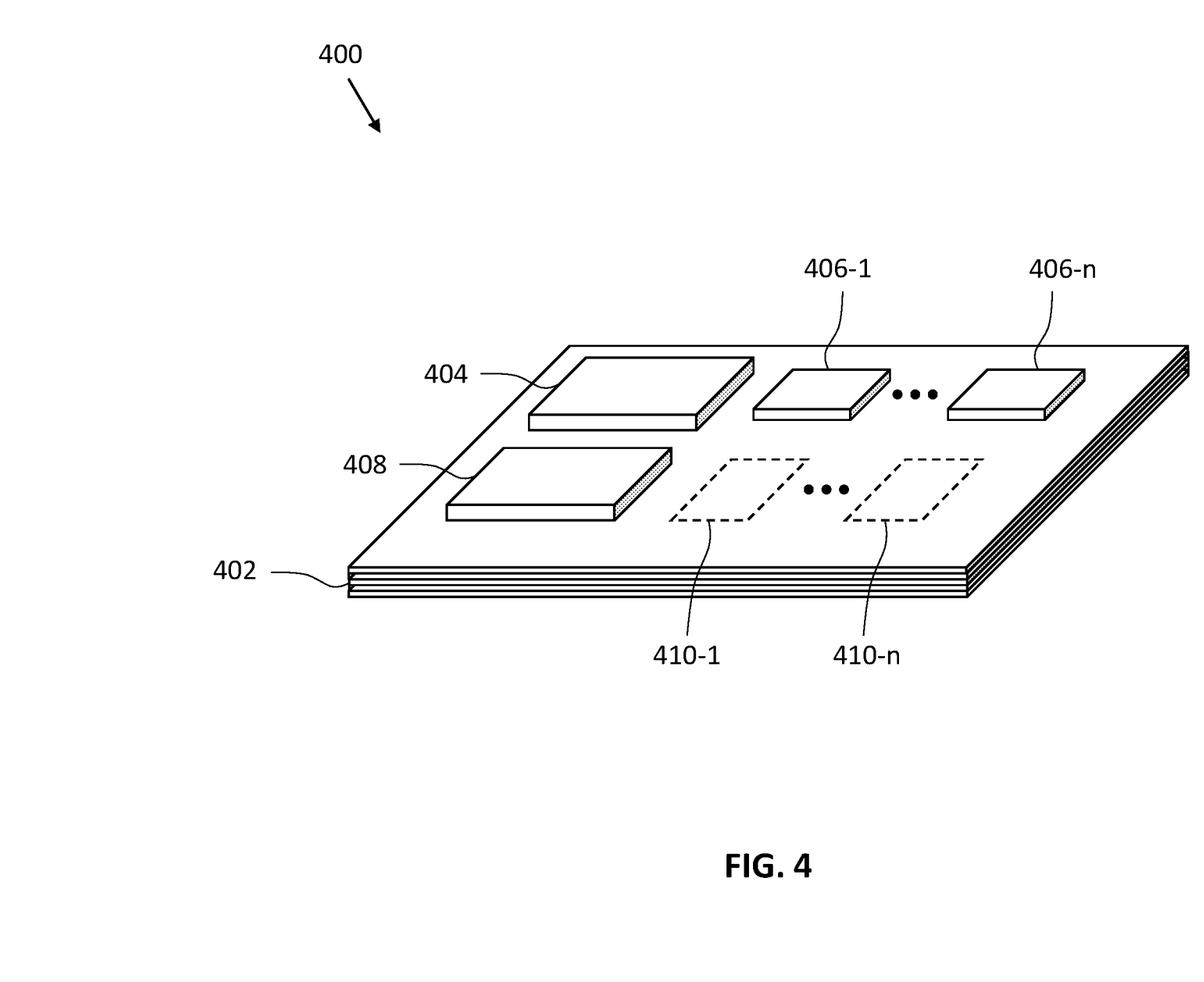
FIG. 4 illustrates a view of the RF front end circuitry of FIG. 2 implemented as a system-in-package (SIP), in accordance with an embodiment of the present disclosure.

FIG. 4 illustrates an example RF system 400 that incorporates the components of RF front end circuitry 104 into a small footprint that can be packaged into a single casing and mounted, for example, to a circuit board. RF system includes a three-dimensional (3D) interposer 402 having any number of layers that include both dielectric and conductive material. 3D interposer 402 may be coupled to a plurality of semiconductor chips. For example, a first semiconductor chip 404 may be provided that includes balanced LNA 208. Accordingly, first semiconductor chip 404 may include GaAs. 3D interposer 402 may also be coupled to a plurality of second semiconductor chips 406-1 to 406-$n$, with each of second semiconductor chips having an amplifier such as first amplifier 216 or second amplifier 224. Accordingly, second semiconductor chips 406-1 to 406-$n$ may include GaAs. In some embodiments, each of the different amplifiers are monolithically integrated onto a same second semiconductor chip. In some embodiments, each of the different amplifiers are monolithically integrated onto first semiconductor chip 404 along with balanced LNA 208. 3D interposer 402 may also be coupled to a third semiconductor chip 408 that includes one or more mixers, such as first mixer 210 and second mixer 218. Accordingly, second semiconductor chip 408 may include SiGe. In some embodiments, 3D interposer 402 includes one or more antennas for receiving RF signals to be processed using the components of RF front end circuitry 104.

According to an embodiment, 3D interposer 402 includes one or more regions 410-1 to 410-$n$ that provide integrated filters constructed from the conductors within 3D interposer 402. For example, different regions 410-1 to 410-$n$ may be used to implement first filter 204, second filter 214, and third filter 222. Each of the filters may be constructed based on coaxial arrangements of conductive lines that are arranged within 3D interposer 402. One example of 3D interposer 402 is the Polystrata® interposer from Cubic Nuvotronics (Durham, N.C.).

Figure 5A:
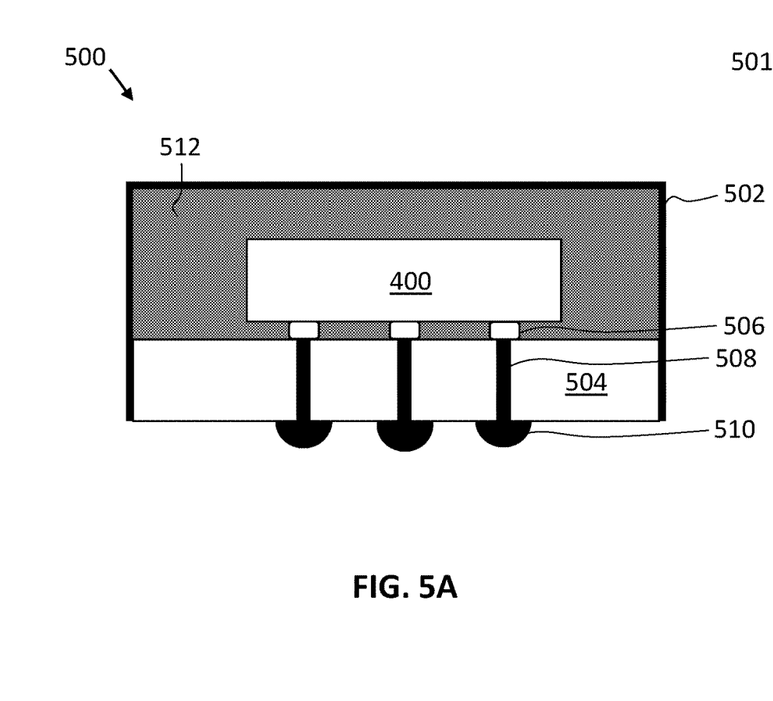
FIG. 5A illustrates a cross-section view of a chip package that may contain a SIP of FIG. 4, in accordance with an embodiment of the present disclosure.

FIG. 5A illustrates an example embodiment of a chip package 500. As can be seen, chip package 500 may be a SIP that includes RF system 400. Other dies may be included as well within chip package 500 and coupled to the same package substrate 504. As can be further seen, chip package 500 includes a housing 502 that is bonded to package substrate 504. Housing 502 may be any material that provides environmental protection for the components of chip package 500. RF system 400 may be conductively coupled to package substrate 504 using connections 506. In some embodiments, connections 506 represent any standard or proprietary connection mechanism, such as solder bumps, ball grid array (BGA), pins, or wire bonds, to name a few examples. Package substrate 504 may include a dielectric material having conductive pathways (e.g., including conductive vias and lines) extending through the dielectric material between the faces of package substrate 504, or between different locations on each face. For example, package substrate 504 may include multiple stacked layers of dielectric material with conductive traces running surfaces of one or more of the layers of dielectric material, and one or more conductive vias extending between any number of the layers of dielectric material. In some embodiments, package substrate 504 may have a thickness less than 1 millimeter (e.g., between 0.1 millimeters and 0.5 millimeters), although any number of package geometries can be used. Additional conductive contacts 510 may be disposed at an opposite face of package substrate 504 for conductively contacting, for instance, a printed circuit board or another chip package. One or more vias 508 extend through a thickness of package substrate 504 to provide conductive pathways between one or more of connections 506 to one or more of contacts 510. Vias 508 may be single straight columns (as illustrated), however, other configurations can be used (e.g., damascene, dual damascene, through-silicon via). In still other embodiments, vias 508 are fabricated by multiple smaller stacked vias, or are staggered at different locations across various ones of the stacked dielectric layers of package substrate 504. Contacts 510 may be solder balls (e.g., for bump-based connections or a ball grid array arrangement), but any suitable package bonding mechanism may be used (e.g., pins in a pin grid array arrangement or lands in a land grid array arrangement). In some embodiments, a solder resist is disposed between contacts 510, to inhibit shorting.

In some embodiments, a mold material 512 may be disposed around RF system 400 included within housing 502. In some embodiments, mold material 512 is included between RF system 400 and package substrate 504 as an underfill material, as well as between RF system 400 and housing 502 as an overfill material). The dimensions and qualities of mold material 512 can vary depending on the type of chip package used and the environment the package is used in. In some embodiments, a thickness of mold material 512 is less than 1 millimeter. Example materials that may be used for mold material 512 include epoxy mold materials. In some cases, mold material 512 is thermally conductive, in addition to being electrically insulating. In some embodiments mold material 512 causes little to no attenuation of RF signals being received by, or transmitted from, RF system 400.

Figure 5B:
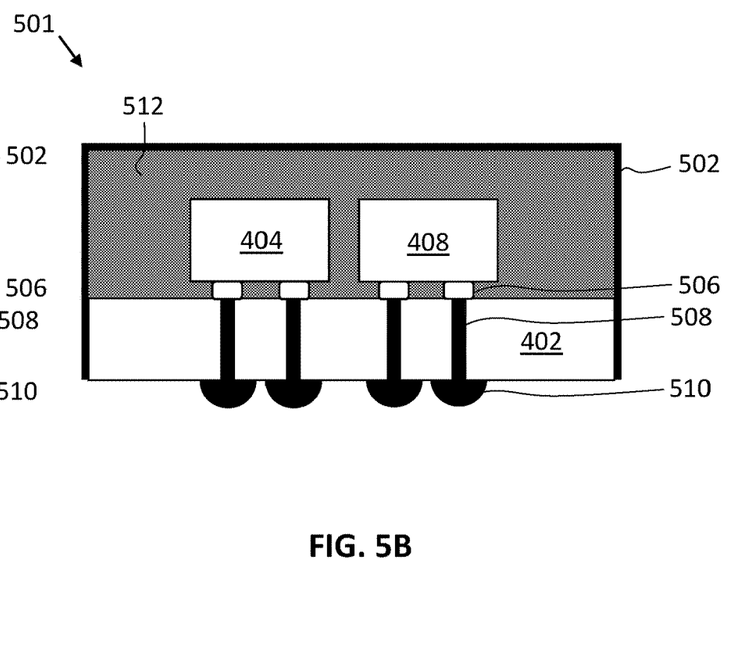
FIG. 5B illustrates a cross-section view of a chip package that may contain a SIP of FIG. 4, in accordance with another embodiment of the present disclosure.

FIG. 5B illustrates another embodiment of a chip package 501. Chip package 501 is also a SIP that instead includes 3D interposer 402 as the package substrate of the chip. According to some embodiments, one or more chips (such as, for example, first semiconductor chip 404 and third semiconductor chip 408) are bonded to 3D interposer 402 using connections 506. The remaining components of chip package 501 may be the same as those described for chip package 500. The separate dies used for first semiconductor chip 404 and third semiconductor chip 408 can be the same material or different materials.

Example Communication Device

Figure 6:
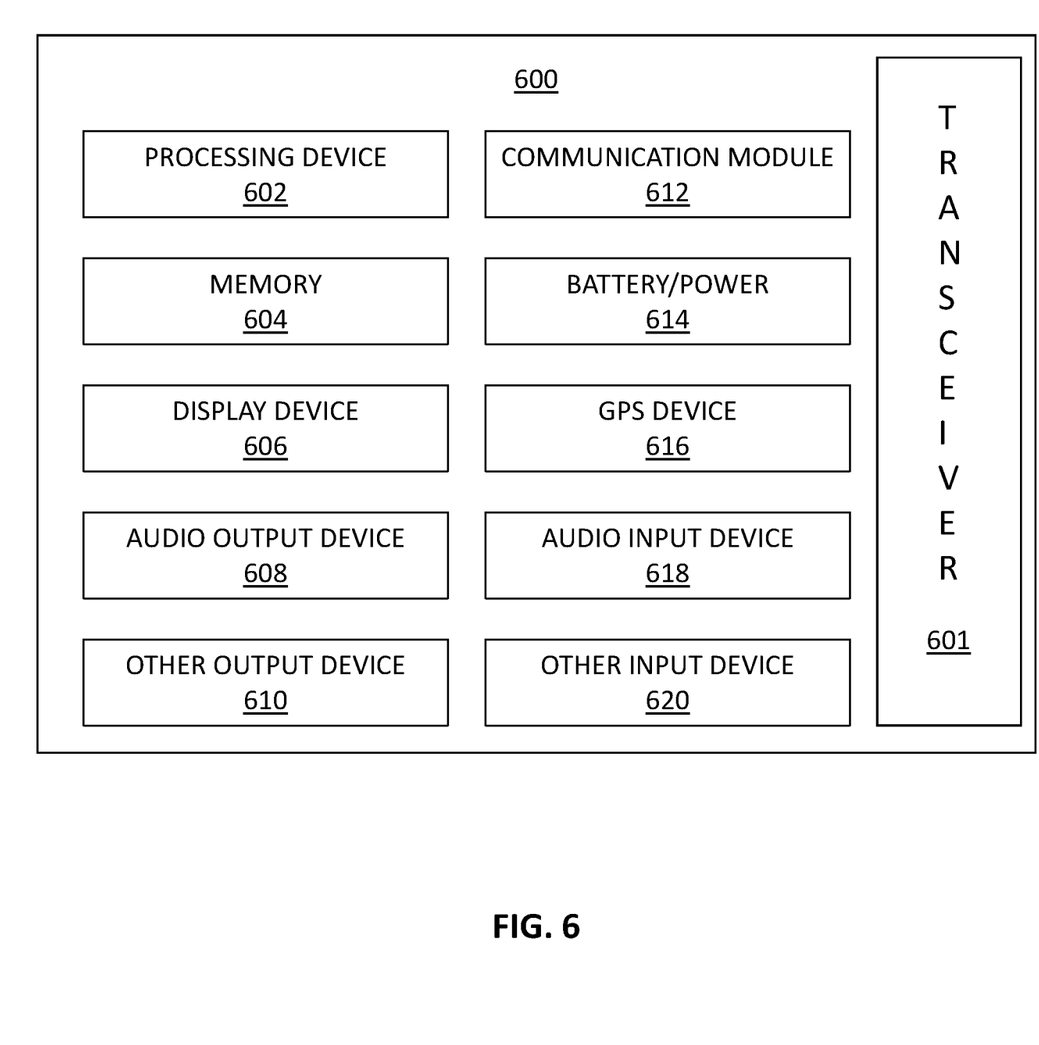
FIG. 6 illustrates a block diagram of an example communication device that may include a wide-band transceiver, in accordance with an embodiment of the present disclosure.

FIG. 6 is a block diagram of an example communication device 600 that may include a wideband receiver, or transceiver, that includes an RF front end circuitry in accordance with any of the embodiments disclosed herein. For example, communication device 600 includes transceiver 601 having RF front end circuitry 104 for receiving wideband GHz-level signals. Other frequency bands may be used as well, depending on the application. In some embodiments transceiver 601 is replaced with a receiver having RF front end circuitry 104. Several components are illustrated in FIG. 6 as included in the communication device 600, but any one or more of these components may be omitted or duplicated, as suitable for the application. In some embodiments, some or all of the components included in the communication device 600 may be attached to one or more motherboards. In some embodiments, some or all of these components are fabricated onto a single SIP.

Additionally, in various embodiments, communication device 600 may not include one or more of the components illustrated in FIG. 6, but communication device 600 may include interface circuitry for coupling to the one or more components. For example, communication device 600 may not include a display device 606, but may include display device interface circuitry (e.g., a connector and driver circuitry) to which display device 606 may be coupled. In another set of examples, communication device 600 may not include an audio input device 618 or an audio output device 608 but may include audio input or output device interface circuitry (e.g., connectors and supporting circuitry) to which audio input device 618 or audio output device 608 may be coupled.

Communication device 600 may include a processing device 602 (e.g., one or more processing devices). As used herein, the term "processing device" or "processor" may refer to any device or portion of a device that processes electronic data from registers and/or memory to transform that electronic data into other electronic data that may be stored in registers and/or memory. Processing device 602 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. Communication device 600 may include a memory 604, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, memory 604 may include memory that shares a die with processing device 602. This memory may be used as cache memory and may include embedded dynamic random access memory (eDRAM) or spin transfer torque magnetic random access memory (STT-MRAM).

In some embodiments, communication device 600 may include a communication module 612 (e.g., one or more communication modules). For example, communication module 612 may be configured for managing wireless communications for the transfer of data to and from communication device 600. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

Communication module 612 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), LTE project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. Communication module 612 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. Communication module 612 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). Communication module 612 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. Communication module 612 may operate in accordance with other wireless protocols in other embodiments. Communication device 600 may include transceiver 601 to facilitate wireless communications and/or to receive other wireless communications (such as AM or FM radio transmissions).

In some embodiments, communication module 612 may manage wired communications, such as electrical, optical, or any other suitable communication protocols (e.g., the Ethernet). As noted above, communication module 612 may include multiple communication modules. For instance, a first communication module may be dedicated to shorter-range wireless communications such as Wi-Fi or Bluetooth, and a second communication module may be dedicated to longer-range wireless communications such as global positioning system (GPS), EDGE, GPRS, CDMA, WiMAX, LTE, EV-DO, or others. In some embodiments, the first communication module may be dedicated to wireless communications, and the second communication module may be dedicated to wired communications.

Communication device 600 may include battery/power circuitry 614. Battery/power circuitry 614 may include one or more energy storage devices (e.g., batteries or capacitors) and/or circuitry for coupling components of communication device 600 to an energy source separate from communication device 600 (e.g., AC line power).

Communication device 600 may include a display device 606 (or corresponding interface circuitry, as discussed above). Display device 606 may include any visual indicators, such as a heads-up display, a computer monitor, a projector, a touchscreen display, a liquid crystal display (LCD), a light-emitting diode display, or a flat panel display.

Communication device 600 may include an audio output device 608 (or corresponding interface circuitry, as discussed above). Audio output device 608 may include any device that generates an audible indicator, such as speakers, headsets, or earbuds.

Communication device 600 may include audio input device 618 (or corresponding interface circuitry, as discussed above). Audio input device 618 may include any device that generates a signal representative of a sound, such as microphones, microphone arrays, or digital instruments (e.g., instruments having a musical instrument digital interface (MIDI) output).

Communication device 600 may include a GPS device 616 (or corresponding interface circuitry, as discussed above). GPS device 616 may be in communication with a satellite-based system and may receive a location of communication device 600, as known in the art.

Communication device 600 may include an-other output device 610 (or corresponding interface circuitry, as discussed above). Examples of other output device 610 may include an audio codec, a video codec, a printer, a wired or wireless transmitter for providing information to other devices, or an additional storage device.

Communication device 600 may include an-other input device 620 (or corresponding interface circuitry, as discussed above). Examples of other input device 620 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

Communication device 600 may have any desired form factor, such as a handheld or mobile communication device (e.g., a cell phone, a smart phone, a mobile internet device, a music player, a tablet computer, a laptop computer, a netbook computer, an ultrabook computer, a personal digital assistant (PDA), an ultra mobile personal computer, etc.), a desktop communication device, a server or other networked computing component, a printer, a scanner, a monitor, a set-top box, an entertainment control unit, a vehicle control unit, a digital camera, a digital video recorder, or a wearable communication device. In some embodiments, the communication device 600 may be any other electronic device that processes data.

Unless specifically stated otherwise, it may be appreciated that terms such as "processing," "computing," "calculating," "determining," or the like refer to the action and/or process of a computer or computing system, or similar electronic computing device, that manipulates and/or transforms data represented as physical quantities (for example, electronic) within the registers and/or memory units of the computer system into other data similarly represented as physical quantities within the registers, memory units, or other such information storage transmission or displays of the computer system. The embodiments are not limited in this context.

The terms "circuit" or "circuitry," as used in any embodiment herein, may comprise, for example, singly or in any combination, hardwired circuitry, programmable circuitry such as computer processors comprising one or more individual instruction processing cores, state machine circuitry, and/or firmware that stores instructions executed by programmable circuitry. The circuitry may include a processor and/or controller configured to execute one or more instructions to perform one or more operations described herein. The instructions may be embodied as, for example, an application, software, firmware, etc. configured to cause the circuitry to perform any of the aforementioned operations. Software may be embodied as a software package, code, instructions, instruction sets and/or data recorded on a computer-readable storage device. Software may be embodied or implemented to include any number of processes, and processes, in turn, may be embodied or implemented to include any number of threads, etc., in a hierarchical fashion. Firmware may be embodied as code, instructions or instruction sets and/or data that are hard-coded (e.g., nonvolatile) in memory devices. The circuitry may, collectively or individually, be embodied as circuitry that forms part of a larger system, for example, an integrated circuit (IC), an application-specific integrated circuit (ASIC), a system on-chip (SoC), desktop computers, laptop computers, tablet computers, servers, smart phones, etc. Other embodiments may be implemented as software executed by a programmable control device. As described herein, various embodiments may be implemented using hardware elements, software elements, or any combination thereof. Examples of hardware elements may include processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), logic gates, registers, semiconductor device, chips, microchips, chip sets, and so forth.

Numerous specific details have been set forth herein to provide a thorough understanding of the embodiments. It will be understood by an ordinarily-skilled artisan, however, that the embodiments may be practiced without these specific details. In other instances, well known operations, components and circuits have not been described in detail so as not to obscure the embodiments. It can be appreciated that the specific structural and functional details disclosed herein may be representative and do not necessarily limit the scope of the embodiments. In addition, although the subject matter has been described in language specific to structural features and/or methodological acts, it is to be understood that the subject matter defined in the appended claims is not necessarily limited to the specific features or acts described herein. Rather, the specific features and acts described herein are disclosed as example forms of implementing the claims.

Further Example Embodiments

The following examples pertain to further embodiments, from which numerous permutations and configurations will be apparent.

Example 1 is a communications receiver that includes a first bandpass filter, a balanced amplifier, a first mixer, a second bandpass filter, a second mixer, and a third bandpass filter. The first bandpass filter receives an input radio frequency (RF) signal and generates a first filtered signal having a first frequency range with a first bandwidth greater than or equal to one octave above a lowest frequency in the first frequency range. The balanced amplifier receives the first filtered signal and suppress distortion products within the first bandwidth. The first mixer receives an output of the balanced amplifier and to mix the output with a first oscillator signal. The second bandpass filter receives an output from the first mixer and to generate a second filtered signal, wherein the second bandpass filter is centered at a first intermediate frequency that is higher than any frequency within the first bandwidth. The second mixer receives the second filtered signal and to mix the second filtered signal with a second oscillator signal. The third bandpass filter receives an output from the second mixer and to generate a third filtered signal, wherein the third bandpass filter is centered at a second intermediate frequency that is lower than the first intermediate frequency.

Example 2 includes the subject matter of Example 1, wherein the first bandwidth is at least 15 GHz.

Example 3 includes the subject matter of Example 1 or 2, wherein the first oscillator signal is configured to be adjustable to within a second frequency range that is higher than the first intermediate frequency.

Example 4 includes the subject matter of any one of Examples 1-3, wherein the first intermediate frequency is higher than at least 1.5 times a highest frequency within the first frequency range.

Example 5 includes the subject matter of any one of Examples 1-4, wherein the second filtered signal has a second bandwidth that is less than or equal to half of the first bandwidth.

Example 6 includes the subject matter of Example 5, wherein the third filtered signal has a third bandwidth that is substantially the same as the second bandwidth.

Example 7 includes the subject matter of any one of Examples 1-6, wherein a frequency of the first oscillator signal is greater than the first intermediate frequency.

Example 8 includes the subject matter of any one of Examples 1-7, wherein the first bandpass filter, the second bandpass filer, and the third bandpass filter are integrated into an interposer.

Example 9 includes the subject matter of Example 8, wherein the balanced amplifier is provided on a first semiconductor chip that is coupled to a first location on the interposer, and the first mixer and the second mixer are each provided on a second semiconductor chip that is coupled to a second location on the interposer.

Example 10 is a system-in-package (SIP) device that includes a three-dimensional interposer, a first bandpass filter integrated into the three-dimensional interposer, a first integrated circuit chip on a first location of the three-dimensional interposer, a second integrated circuit chip on a second location of the three-dimensional interposer, a second bandpass filter integrated into the three-dimensional interposer, and a third bandpass filter integrated into the three-dimensional interposer. The first bandpass filter receives an input radio frequency (RF) signal and to generate a first filtered signal having a first frequency range with a first bandwidth. The first integrated circuit chip includes a balanced amplifier configured to receive the first filtered signal and suppress distortion products within the first frequency range. The second integrated circuit chip comprises a first mixer and a second mixer where the first mixer receives an output of the balanced amplifier and mixes the output with a first oscillator signal. The second bandpass filter receives an output from the first mixer and generates a second filtered signal. The second mixer receives the second filtered signal and mixes the second filtered signal with a second oscillator signal. The third bandpass filter receives an output from the second mixer and generates a third filtered signal.

Example 11 includes the subject matter of Example 10, wherein the first integrated circuit chip comprises gallium arsenide (GaAs), and the second integrated circuit chip comprises silicon germanium (SiGe).

Example 12 includes the subject matter of Example 10 or 11, wherein the second bandpass filter is centered at a first intermediate frequency that is higher than a highest frequency within the first frequency range, and the third bandpass filter is centered at a second intermediate frequency that is lower than the first intermediate frequency.

Example 13 includes the subject matter of any one of Examples 10-12, further comprising a third integrated circuit chip on a third location of the three-dimensional interposer, the third integrated circuit chip comprising an analog-to-digital converter (ADC).

Example 14 includes the subject matter of any one of Examples 10-13, wherein the first bandwidth is greater than or equal to one octave above a lowest frequency in the first frequency range.

Example 15 is a communications receiver system that includes an antenna configured to receive an RF signal, RF front-end circuitry configured to receive the RF signal from the antenna and to generate an amplified portion of the RF signal, an analog-to-digital converter (ADC) configured to receive the amplified portion of the RF signal and to generate a digitized signal, and a digital signal processor configured to receive the digitized signal. The RF front-end circuitry includes a three-dimensional interposer, a first integrated circuit chip on a first location of the three-dimensional interposer, a second integrated circuit chip on a second location of the three-dimensional interposer, a second bandpass filter integrated into the three-dimensional interposer, and a third bandpass filter integrated into the three-dimensional interposer. The first bandpass filter receives an input radio frequency (RF) signal and to generate a first filtered signal having a first frequency range with a first bandwidth. The first integrated circuit chip includes a balanced amplifier configured to receive the first filtered signal and suppress distortion products within the first frequency range. The second integrated circuit chip comprises a first mixer and a second mixer where the first mixer receives an output of the balanced amplifier and mixes the output with a first oscillator signal. The second bandpass filter receives an output from the first mixer and generates a second filtered signal. The second mixer receives the second filtered signal and mixes the second filtered signal with a second oscillator signal. The third bandpass filter receives an output from the second mixer and generates a third filtered signal.

Example 16 includes the subject matter of Example 15, wherein the first bandwidth is greater than or equal to one octave above a lowest frequency in the first frequency range.

Example 17 includes the subject matter of Example 15 or 16, wherein the first integrated circuit chip comprises gallium arsenide (GaAs), and the second integrated circuit chip comprises silicon germanium (SiGe).

Example 18 includes the subject matter of any one of Examples 15-17, wherein the second bandpass filter is centered at a first intermediate frequency that is higher than a highest frequency within the first frequency range, and the third bandpass filter is centered at a second intermediate frequency that is lower than the first intermediate frequency.

Example 19 includes the subject matter of any one of Examples 15-18, further comprising a third integrated circuit chip on a third location of the three-dimensional interposer, the third integrated circuit chip comprising the ADC.

Example 20 includes the subject matter of any one of Examples 15-19, wherein the three-dimensional interposer includes the antenna.

What is claimed is:

1. A communications receiver, comprising:
   a first bandpass filter configured to receive an input radio frequency (RF) signal and to generate a first filtered signal having a first frequency range with a first bandwidth greater than or equal to one octave above a lowest frequency in the first frequency range;
   a balanced amplifier configured to receive the first filtered signal and suppress distortion products within the first bandwidth;
   a first mixer configured to receive an output of the balanced amplifier and to mix the output with a first oscillator signal;
   a second bandpass filter configured to receive an output from the first mixer and to generate a second filtered signal, wherein the second bandpass filter is centered at a first intermediate frequency that is higher than any frequency within the first bandwidth;
   a second mixer configured to receive the second filtered signal and to mix the second filtered signal with a second oscillator signal; and
   a third bandpass filter configured to receive an output from the second mixer and to generate a third filtered signal, wherein the third bandpass filter is centered at a second intermediate frequency that is lower than the first intermediate frequency.

2. The communications receiver of claim 1, wherein the first bandwidth is at least 15 GHz.

3. The communications receiver of claim 1, wherein the first oscillator signal is configured to be adjustable to within a second frequency range that is higher than the first intermediate frequency.

4. The communications receiver of claim 1, wherein the first intermediate frequency is higher than at least 1.5 times a highest frequency within the first frequency range.

5. The communications receiver of claim 1, wherein the second filtered signal has a second bandwidth that is less than or equal to half of the first bandwidth.

6. The communications receiver of claim 5, wherein the third filtered signal has a third bandwidth that is substantially the same as the second bandwidth.

7. The communications receiver of claim 1, wherein a frequency of the first oscillator signal is greater than the first intermediate frequency.

8. The communications receiver of claim 1, wherein the first bandpass filter, the second bandpass filer, and the third bandpass filter are integrated into an interposer.

9. The communications receiver of claim 8, wherein the balanced amplifier is provided on a first semiconductor chip that is coupled to a first location on the interposer, and the first mixer and the second mixer are each provided on a second semiconductor chip that is coupled to a second location on the interposer.

10. A system-in-package (SIP) device, comprising:
    a three-dimensional interposer;
    a first bandpass filter integrated into the three-dimensional interposer, wherein the first bandpass filter is configured to receive an input radio frequency (RF) signal and to generate a first filtered signal having a first frequency range with a first bandwidth;
    a first integrated circuit chip on a first location of the three-dimensional interposer, wherein the first integrated circuit chip includes a balanced amplifier configured to receive the first filtered signal and suppress distortion products within the first frequency range;
    a second integrated circuit chip on a second location of the three-dimensional interposer, wherein the second integrated circuit chip includes a first mixer and a second mixer, and wherein the first mixer is configured to receive an output of the balanced amplifier and to mix the output with a first oscillator signal;
    a second bandpass filter integrated into the three-dimensional interposer, wherein the second bandpass filter is configured to receive an output from the first mixer and to generate a second filtered signal, wherein the second bandpass filter is centered at a first intermediate frequency that is higher than a highest frequency within the first frequency range, and wherein the second mixer is configured to receive the second filtered signal and to mix the second filtered signal with a second oscillator signal; and
    a third bandpass filter integrated into the three-dimensional interposer, wherein the third bandpass filter is configured to receive an output from the second mixer and to generate a third filtered signal, and the third bandpass filter is centered at a second intermediate frequency that is lower than the first intermediate frequency.

11. The SIP device of claim 10, wherein the first integrated circuit chip comprises gallium arsenide (GaAs), and the second integrated circuit chip comprises silicon germanium (SiGe).

12. The SIP device of claim 10, further comprising a third integrated circuit chip on a third location of the three-dimensional interposer, the third integrated circuit chip comprising an analog-to-digital converter (ADC).

13. The SIP device of claim 10, wherein the first bandwidth is greater than or equal to one octave above a lowest frequency in the first frequency range.

14. A communications receiver system, comprising:
    an antenna configured to receive an RF signal;
    an RF front-end circuitry configured to receive the RF signal from the antenna and to generate an amplified portion of the RF signal;
    an analog-to-digital converter (ADC) configured to receive the amplified portion of the RF signal and to generate a digitized signal; and
    a digital signal processor configured to receive the digitized signal;
    wherein the RF front-end circuitry includes
      a three-dimensional interposer;
      a first bandpass filter integrated into the three-dimensional interposer, wherein the first bandpass filter is configured to receive the RF signal and to generate a first filtered signal having a first frequency range with a first bandwidth;
      a first integrated circuit chip on a first location of the three-dimensional interposer, wherein the first integrated circuit chip includes a balanced amplifier configured to receive the first filtered signal and suppress distortion products within the first frequency range;
      a second integrated circuit chip on a second location of the three-dimensional interposer, wherein the second integrated circuit chip includes a first mixer and a second mixer, wherein the first mixer is configured to receive an output of the balanced amplifier and to mix the output with a first oscillator signal;

a second bandpass filter integrated into the three-dimensional interposer, wherein the second bandpass filter is configured to receive an output from the first mixer and to generate a second filtered signal, wherein the second bandpass filter is centered at a first intermediate frequency that is higher than a highest frequency within the first frequency range, and wherein the second mixer is configured to receive the second filtered signal and to mix the second filtered signal with a second oscillator signal; and a third bandpass filter integrated into the three-dimensional interposer, wherein the third bandpass filter is configured to receive an output from the second mixer and to generate a third filtered signal, and wherein the third bandpass filter is centered at a second intermediate frequency that is lower than the first intermediate frequency.

15. The communications receiver system of claim 14, wherein the first bandwidth is greater than or equal to one octave above a lowest frequency in the first frequency range.

16. The communications receiver system of claim 14, wherein the first integrated circuit chip comprises gallium arsenide (GaAs), and the second integrated circuit chip comprises silicon germanium (SiGe).

17. The communications receiver system of claim 14, further comprising a third integrated circuit chip on a third location of the three-dimensional interposer, the third integrated circuit chip comprising the ADC.

18. The communications receiver system of claim 14, wherein the three-dimensional interposer includes the antenna.

* * * * *